(12) United States Patent
Kuo et al.

(10) Patent No.: US 9,865,700 B2
(45) Date of Patent: Jan. 9, 2018

(54) MOS P-N JUNCTION DIODE WITH ENHANCED RESPONSE SPEED AND MANUFACTURING METHOD THEREOF

(71) Applicant: PFC DEVICE HOLDINGS LTD, Chai Wan (HK)

(72) Inventors: Hung-Hsin Kuo, New Taipei (TW); Mei-Ling Chen, New Taipei (TW)

(73) Assignee: PFC DEVICE HOLDINGS LTD, Chai Wan (HK)

( * ) Notice: Subject to any disclaimer, the term of this patent is extended or adjusted under 35 U.S.C. 154(b) by 0 days.

(21) Appl. No.: 15/413,694

(22) Filed: Jan. 24, 2017

(65) Prior Publication Data
US 2017/0133480 A1   May 11, 2017

Related U.S. Application Data

(62) Division of application No. 15/141,039, filed on Apr. 28, 2016, now Pat. No. 9,595,617, which is a division
(Continued)

(30) Foreign Application Priority Data

Dec. 28, 2011   (TW) .............................. 100149213 A

(51) Int. Cl.
| | |
|---|---|
| *H01L 21/336* | (2006.01) |
| *H01L 29/66* | (2006.01) |
| *H01L 29/868* | (2006.01) |
| *H01L 21/288* | (2006.01) |
| *H01L 21/3213* | (2006.01) |

(Continued)

(52) U.S. Cl.
CPC .. *H01L 29/66136* (2013.01); *H01L 21/26513* (2013.01); *H01L 21/288* (2013.01); *H01L 21/324* (2013.01); *H01L 21/3215* (2013.01); *H01L 21/32133* (2013.01); *H01L 21/32139* (2013.01); *H01L 29/0619* (2013.01);
(Continued)

(58) Field of Classification Search
CPC ................. H01L 29/785; H01L 21/288; H01L 21/31155; H01L 21/32133; H01L 21/32139; H01L 21/3215; H01L 29/8611; H01L 29/868
USPC .......................................................... 438/289
See application file for complete search history.

(56) References Cited

U.S. PATENT DOCUMENTS

| | | |
|---|---|---|
| 6,624,030 B2 | 9/2003 | Chang et al. |
| 6,740,951 B2 | 5/2004 | Tsui et al. |

(Continued)

*Primary Examiner* — Theresa T Doan
(74) *Attorney, Agent, or Firm* — WPAT, PC

(57) ABSTRACT

A MOS P-N junction diode includes a semiconductor substrate, a mask layer, a guard ring, a gate oxide layer, a polysilicon structure, a central conductive layer, a silicon nitride layer, a metal diffusion layer, a channel region, and a metal sputtering layer. For manufacturing the MOS P-N junction diode, a mask layer is formed on a semiconductor substrate. A gate oxide layer is formed on the semiconductor substrate, and a polysilicon structure is formed on the gate oxide layer. A guard ring, a central conductive layer and a channel region are formed in the semiconductor substrate. A silicon nitride layer is formed on the central conductive layer. A metal diffusion layer is formed within the guard ring and the central conductive layer. Afterwards, a metal sputtering layer is formed, and the mask layer is partially exposed.

8 Claims, 10 Drawing Sheets

Related U.S. Application Data of application No. 14/556,676, filed on Dec. 1, 2014, now Pat. No. 9,362,350, which is a division of application No. 13/726,740, filed on Dec. 26, 2012, now Pat. No. 8,921,949.

(51) Int. Cl.
*H01L 21/3215* (2006.01)
*H01L 21/324* (2006.01)
*H01L 29/06* (2006.01)
*H01L 29/45* (2006.01)
*H01L 29/51* (2006.01)
*H01L 21/265* (2006.01)

(52) U.S. Cl.
CPC .......... *H01L 29/456* (2013.01); *H01L 29/517* (2013.01); *H01L 29/868* (2013.01)

(56) References Cited

U.S. PATENT DOCUMENTS

| | | |
|---|---|---|
| 6,835,624 B2 | 12/2004 | Pong et al. |
| 6,940,145 B2 | 9/2005 | Blair et al. |
| 7,973,381 B2 | 7/2011 | Chiola |
| 2002/0011644 A1* | 1/2002 | Lee ................... H01L 21/76235 257/510 |
| 2003/0025152 A1 | 2/2003 | Werner et al. |
| 2005/0029585 A1 | 2/2005 | He et al. |

\* cited by examiner

MOS P-N JUNCTION DIODE WITH ENHANCED RESPONSE SPEED AND MANUFACTURING METHOD THEREOF

This is a divisional application of co-pending U.S. application Ser. No. 15/141,039, filed Apr. 28, 2016, which is a divisional application of U.S. Pat. No. 9,362,350, issued Jun. 7, 2016, which is a divisional application of U.S. Pat. No. 8,921,949, issued Dec. 30, 2014, which claims the benefit of Taiwan Patent Application No. 100149213, filed Dec. 28, 2011, the subject matter of which is incorporated herein by reference.

FIELD OF THE INVENTION

The present invention relates to a metal-oxide-semiconductor (MOS) P-N junction diode, and more particularly to a MOS P-N junction diode with short reverse recovery time. The present invention also relates to a method for manufacturing such a diode.

BACKGROUND OF THE INVENTION

A Schottky diode is a unipolar device using electrons as carriers. Since the carrier recombination is nearly eliminated, the switching speed is high. Moreover, in response to a low forward bias voltage, the Schottky diode has higher forward current and shorter reverse recovery time. In response to a high reverse bias voltage, the Schottky diode has the relatively high reverse leakage current. The high reverse leakage current is related to the Schottky barrier determined by the metal work function of the metal electrode, the band gap of the intrinsic semiconductor, the type and concentration of dopants in the semiconductor layer, and other factors. In contrast to the Schottky diode, a P-N junction diode is a bipolar device that can pass more current than the Schottky diode. However, the P-N junction diode has a forward turn-on voltage higher than that of the Schottky diode, and takes longer reverse recovery time due to a slow and random recombination of electrons and holes during the recovery period.

For combining the benefits of the Schottky diode and the P-N junction diode, a configuration of a gated diode has been disclosed. The gated diode has comparable or lower forward turn-on voltage with respect to the Schottky diode. The reverse leakage current of the gated diode is similar to the P-N junction diode, but is lower than the Schottky diode. The reverse recovery time at high temperature of the gated diode is close to or slightly longer than the Schottky diode. The interface tolerance temperature of the gated diode is higher than the Schottky diode. In practical applications, the gated diode is advantageous over the Schottky diode.

A typical gated diode has been disclosed in U.S. Pat. No. 6,624,030, which is entitled "Method of fabricating power rectifier device having a laterally graded P-N junction for a channel region". Please refer to FIGS. 1A~1L, which schematically illustrate a method of manufacturing a gated diode.

Firstly, as shown in FIG. 1A, an N+ substrate 20 with an N− epitaxial layer 22 grown thereon is provided, wherein a field oxide layer 50 is grown on the surface of the N− epitaxial layer 22. Then, as shown in FIG. 1B, a photoresist layer 52 is formed on the field oxide layer 50. A first photolithography and etching process is performed to partially remove the field oxide layer 50. Then, a first ion implantation process is performed to dope the substrate with boron ion (B+) through openings in the photoresist layer 52.

After the photoresist layer 52 is removed, a boron thermal drive-in process is perform to form edge P-doped structures 28 and a center P-doped structure 30 (see FIG. 10). Then, a second ion implantation process is performed to dope the substrate with BF2. Then, a second photolithography and etching process is performed to use a photoresist layer 54 to cover the periphery of the device area and remove the field oxide layer 50 in the center of the device area (see FIG. 1D and FIG. 1E).

After the photoresist layer 54 is removed, a gate oxide layer 56, a polysilicon layer 58 and a silicon nitride layer 60 are sequentially grown, and an arsenic implantation process is made (see FIG. 1F). Then, as shown in FIG. 1G, an oxide layer 62 is formed on the resulting structure of FIG. 1F by a chemical vapor deposition (CVD) process. Then, a third photolithography process is performed to form a gate-pattern photoresist layer 64 over the oxide layer 62. Then, a wet etching process is performed to etch the oxide layer 62 while leaving the oxide layer 62 under the gate-pattern photoresist layer 64 (see FIG. 1H). Then, as shown in FIG. 1I, a dry etching process is performed to partially remove the silicon nitride layer 60, and a third ion implantation process is performed to dope the substrate with boron ion (B+). Consequently, a P-type layer 66 of a channel region is formed.

Then, as shown in FIG. 1J, the remaining photoresist layer 64 is removed, and a fourth ion implantation process is performed to dope the substrate with boron ion (B+) to form a laterally-graded P-type pocket 36. Then, a wet etching process is performed to remove the silicon oxide layer 62, and a dry etching process is performed to partially remove the polysilicon layer 58 (FIG. 1K). Then, as shown in FIG. 1L, a wet etching process is performed to remove the remaining silicon nitride layer 60, and an arsenic implantation process is performed to form an N-doped source/drain region 24. Meanwhile, some fabricating steps of the gated diode have been done. After subsequent steps (e.g. metallic layer formation, photolithography and etching process, and so on) are carried out, the front-end process of the wafer is completed.

In comparison with the Schottky diode, the gated diode fabricated by the above method has comparable forward turn-on voltage, lower reverse leakage current, higher interface tolerance temperature, better reliability result. However, since the gated diode has longer reverse recovery time (at the room temperature) than the Schottky diode, the device performance is deteriorated.

SUMMARY OF THE INVENTION

An embodiment of the present invention provides a method for manufacturing a MOS P-N junction diode with enhanced response speed. The method includes the following steps. Firstly, a semiconductor substrate is provided. Then, a first ion implantation process and a thermal drive-in process are performed to form a guard ring in the semiconductor substrate. Then, a mask layer is formed on the semiconductor substrate. Then, a gate oxide layer is formed on the semiconductor substrate and the guard ring, a polysilicon structure is formed on the gate oxide layer and the mask layer, and a polysilicon oxide layer is formed on the polysilicon structure. Then, an etching process is performed to partially remove the polysilicon oxide layer, the polysilicon structure and the gate oxide layer, and a second ion implantation process is performed to form a central conductive layer in the semiconductor substrate. Then, a third ion implantation process is performed to form a channel region beside the central conductive layer. Then, a silicon nitride layer is formed on a part of the central conductive layer. Then, a metallic evaporation film is formed on exposed surfaces of the mask layer, the polysilicon oxide layer, the guard ring, the central conductive layer and the silicon nitride layer. Then, a diffusion treatment is performed to diffuse the material of the metallic evaporation film into the guard ring and the central conductive layer, thereby forming a metal diffusion layer within the guard ring and the central conductive layer. After the silicon nitride layer is removed, a metal sputtering layer is formed on exposed surfaces of the mask layer, the polysilicon structure, the guard ring, the central conductive layer and the silicon nitride side-wall. Afterwards, the metal sputtering layer is etched to partially remove the metal sputtering layer, so that a part of the mask layer is exposed.

An embodiment of the present invention provides a MOS P-N junction diode. The MOS P-N junction diode includes a semiconductor substrate, a mask layer, a guard ring, a gate oxide layer, a polysilicon structure, a central conductive layer, a silicon nitride layer, a metal diffusion layer, a channel region, and a metallic sputtering layer. The mask layer is formed on the semiconductor substrate, wherein a surface of the mask layer is partially exposed. The guard ring is formed in the semiconductor substrate by an ion implantation process and a thermal drive-in process, wherein a first side of the guard ring is connected with the mask layer. The gate oxide layer is formed on a part of the semiconductor substrate. The polysilicon structure is formed on the gate oxide layer. The central conductive layer is formed in the semiconductor substrate by another ion implantation process, wherein a part of the central conductive layer is connected with a second side of the guard ring, and the central conductive layer is separated from the gate oxide layer. The silicon nitride layer is formed on a part of the surface of the central conductive layer, and located at bilateral sides of the polysilicon structure, wherein the silicon nitride layer is protruded over the polysilicon structure. The metal diffusion layer is formed within the guard ring and the central conductive layer by diffusion. The channel region is formed in the semiconductor substrate by a further ion implantation process, wherein the channel region is located beside the central conductive layer and disposed under the gate oxide layer. The metallic sputtering layer is formed on the mask layer, the polysilicon structure, the guard ring, the central conductive layer and the silicon nitride layer.

Another embodiment of the present invention provides a method for manufacturing a MOS P-N junction diode. The method includes the following steps. Firstly, a semiconductor substrate is provided. Then, a first ion implantation process and a thermal drive-in process are performed to form a guard ring in the semiconductor substrate. Then, a mask layer is formed on the semiconductor substrate. Then, a gate oxide layer is formed on the semiconductor substrate and the guard ring, a polysilicon structure is formed on the gate oxide layer and the mask layer, and a polysilicon oxide layer is formed on the polysilicon structure. Then, an etching process is performed to partially remove the polysilicon oxide layer, the polysilicon structure and the gate oxide layer, and a second ion implantation process is performed to form a central conductive layer in the semiconductor substrate. Then, a third ion implantation process is performed to form an ion implantation layer within the guard ring and the central conductive layer. Then, a fourth implantation process is performed to form a channel region beside the central conductive layer. Then, a metal sputtering layer is formed on exposed surfaces of the mask layer, the polysilicon structure, the polysilicon oxide layer, the guard ring, the central conductive layer and the gate oxide layer. Afterwards, the metal sputtering layer is etched to partially remove the metal sputtering layer, so that a part of the mask layer is exposed.

Another embodiment of the present invention provides a MOS P-N junction diode. The MOS P-N junction diode includes a semiconductor substrate, a mask layer, a guard ring, a gate oxide layer, a polysilicon structure, a polysilicon oxide layer, a central conductive layer, an ion implantation layer, a channel region, and a metallic sputtering layer. The mask layer is formed on the semiconductor substrate, wherein a surface of the mask layer is partially exposed. The guard ring is formed in the semiconductor substrate by a first ion implantation process and a thermal drive-in process, wherein a first side of the guard ring is connected with the mask layer. The gate oxide layer is formed on a part of the semiconductor substrate. The polysilicon structure is formed on the gate oxide layer. The polysilicon oxide layer is formed on the polysilicon structure. The central conductive layer is formed in the semiconductor substrate by a second ion implantation process, wherein a part of the central conductive layer is connected with a second side of the guard ring, and the central conductive layer is separated from the gate oxide layer. The ion implantation layer is formed within the guard ring and the central conductive layer by a third ion implantation process. The channel region is formed in the semiconductor substrate by a fourth ion implantation process, wherein the channel region is located beside the central conductive layer and disposed under the gate oxide layer. The metallic sputtering layer is formed on the mask layer, the polysilicon structure, the polysilicon oxide layer, the guard ring, the central conductive layer and the gate oxide layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
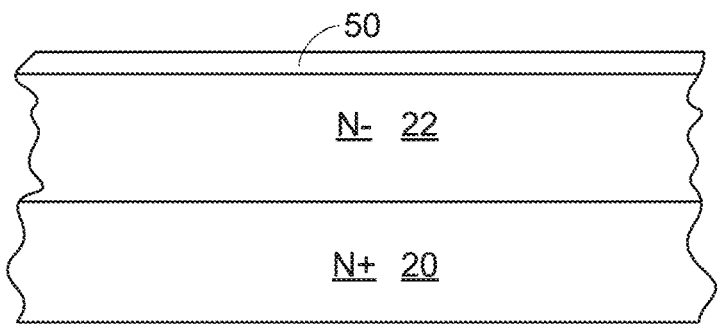
FIGS. 1A~1L (prior art) schematically illustrate a method of manufacturing a gated diode according to the prior art.
Figure 1B:
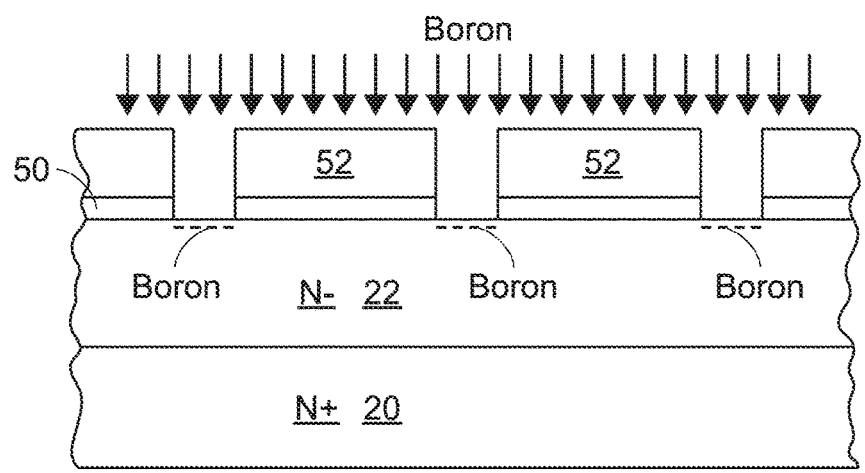
Figure 1C:
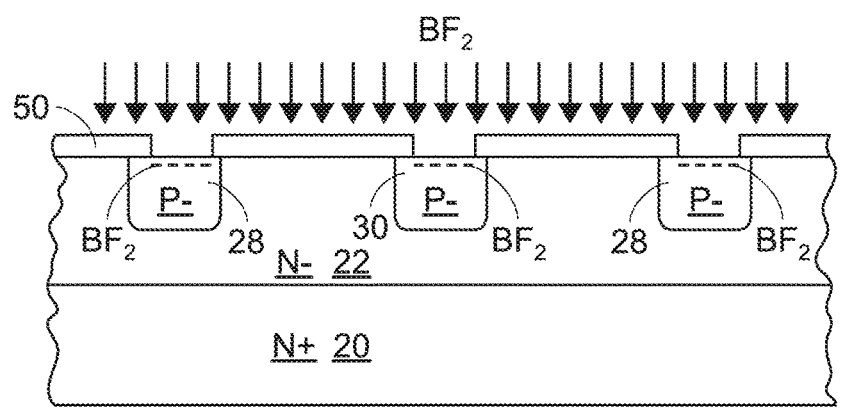
Figure 1D:
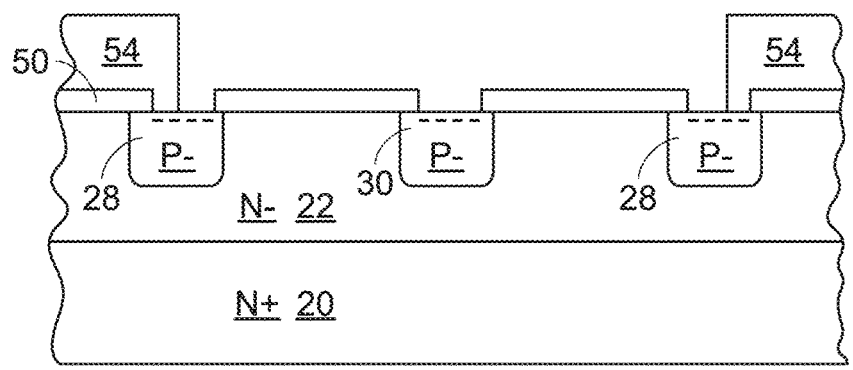
Figure 1E:
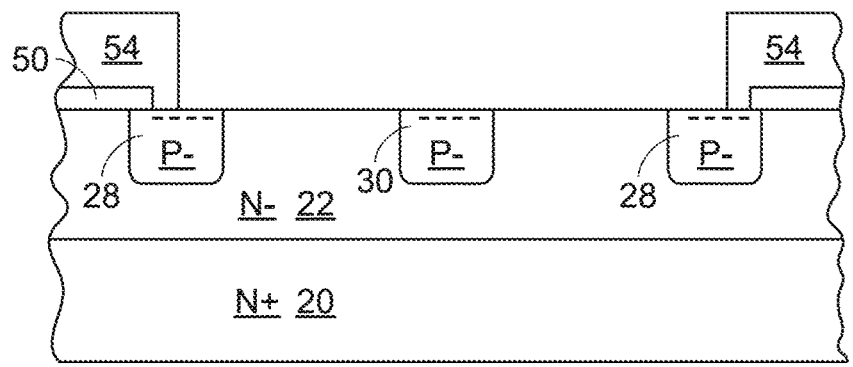
Figure 1F:
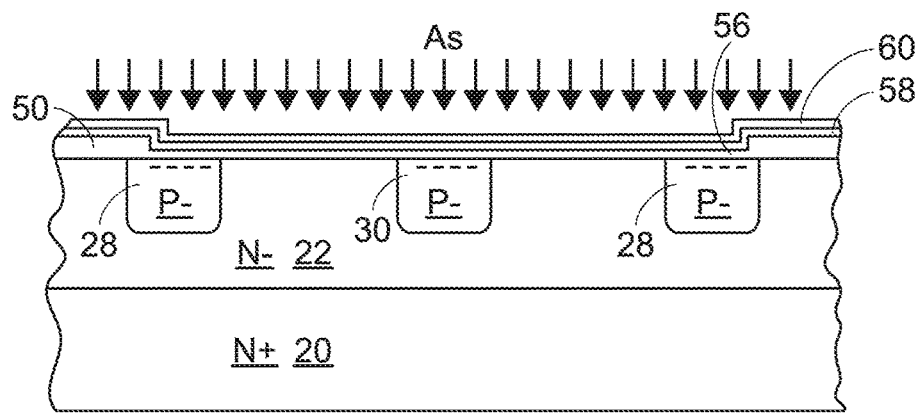
Figure 1G:
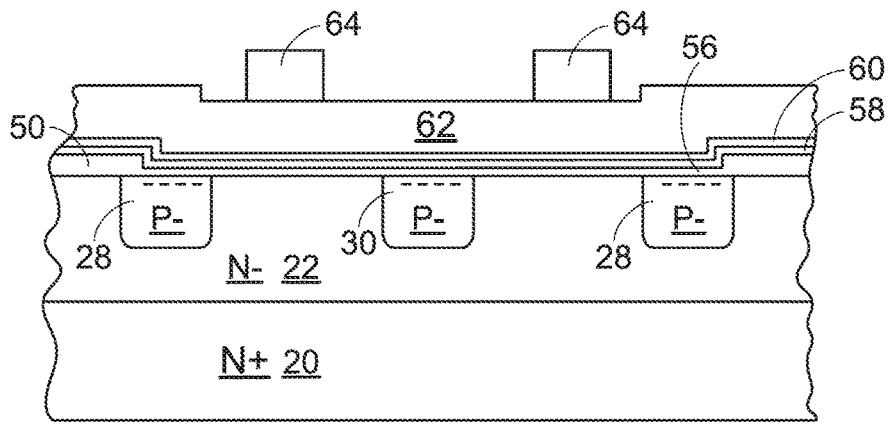
Figure 1H:
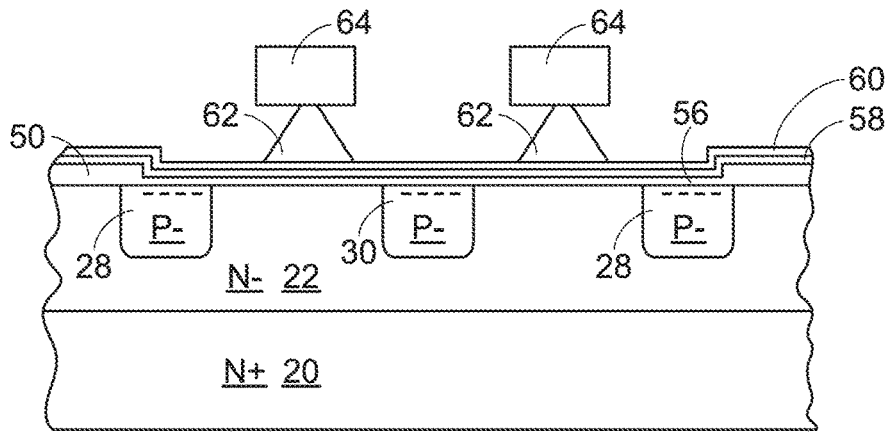
Figure 1I:
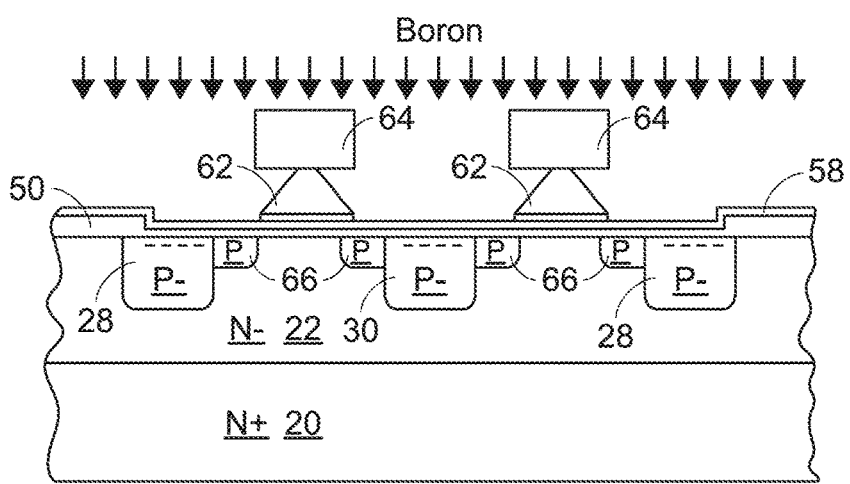
Figure 1J:
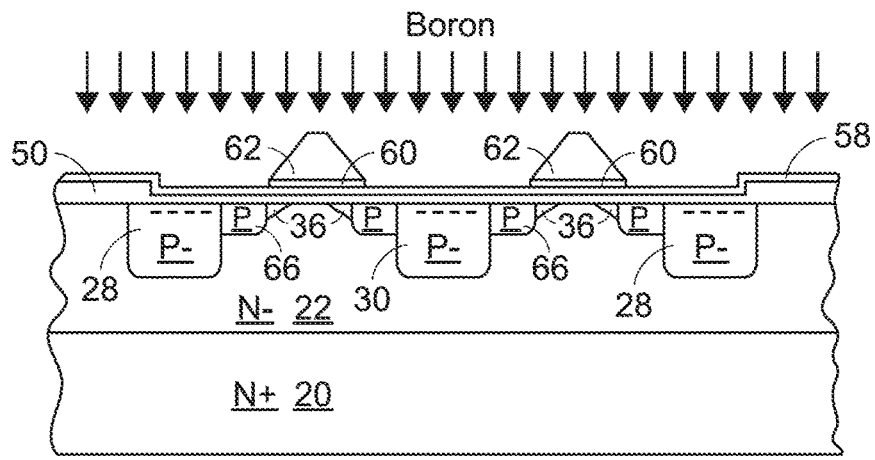
Figure 1K:
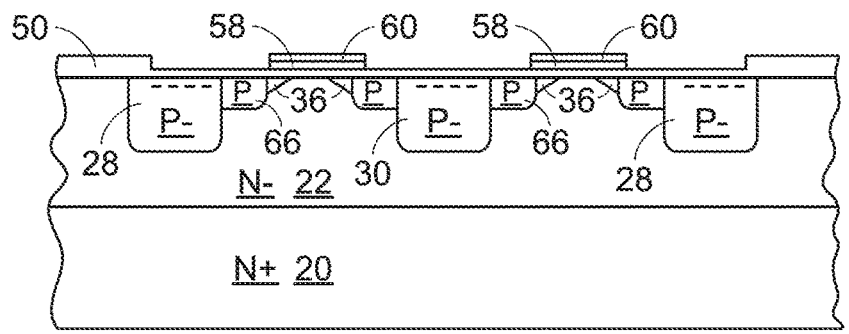
Figure 1L:
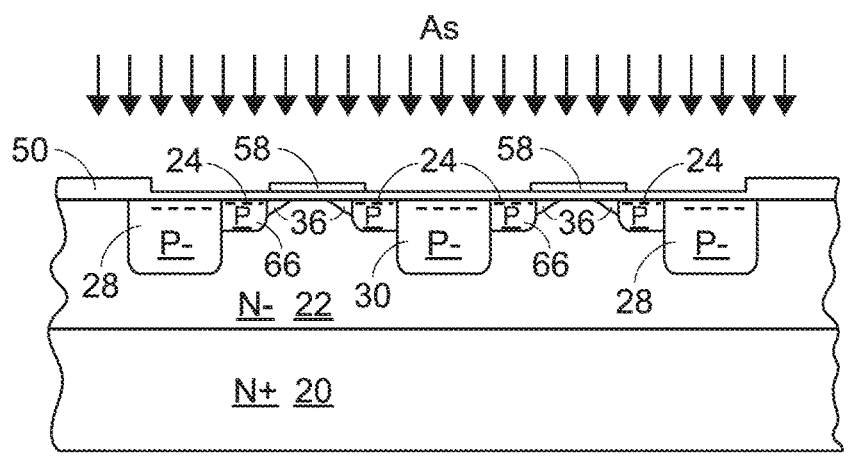
Figure 2A:
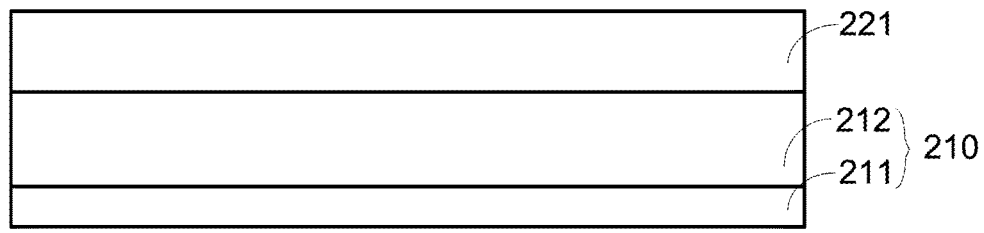
FIGS. 2A~2Q schematically illustrate a method of manufacturing a metal-oxide-semiconductor (MOS) P-N junction diode with enhanced response speed according to a first embodiment of the present invention.
Figure 2B:
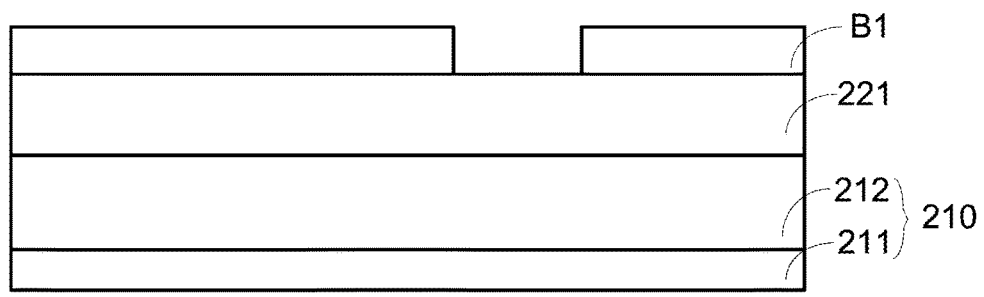
Figure 2C:
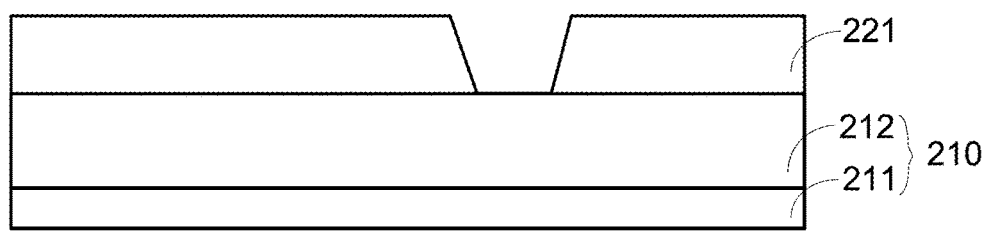
Figure 2D:
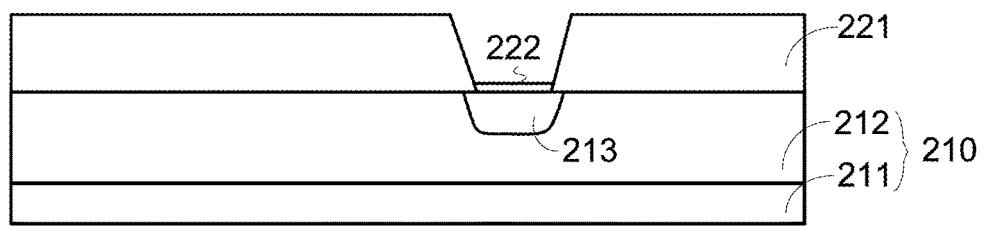
Figure 2E:
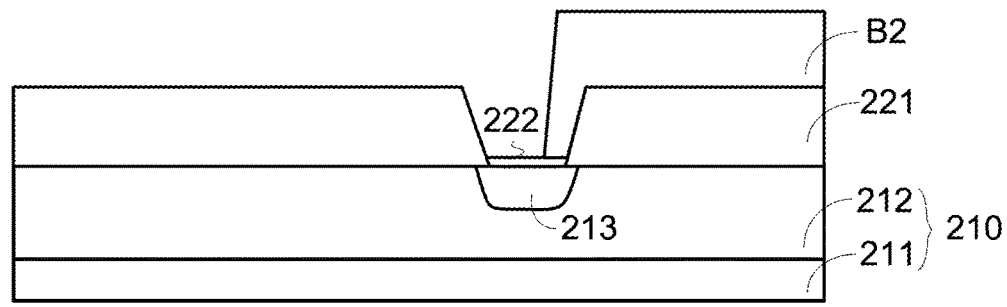
Figure 2F:
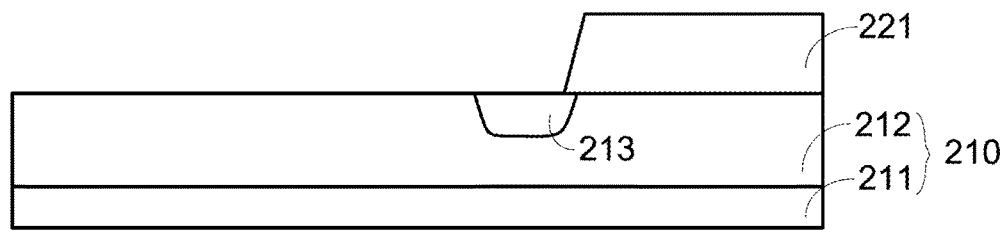
Figure 2G:
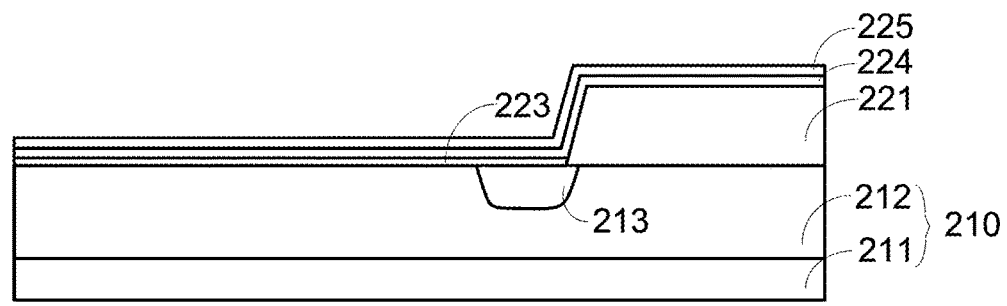
Figure 2H:
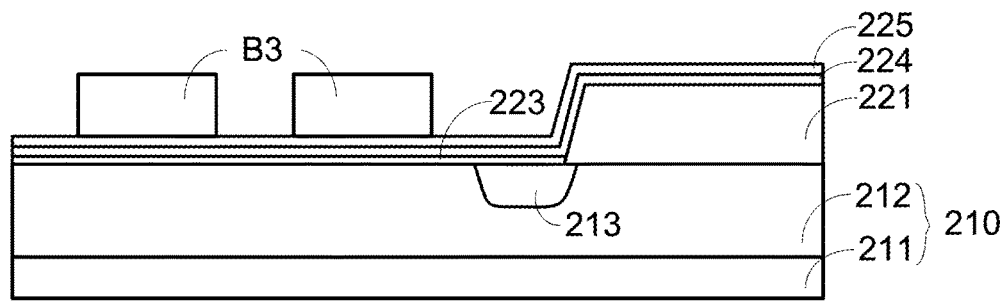
Figure 2I:
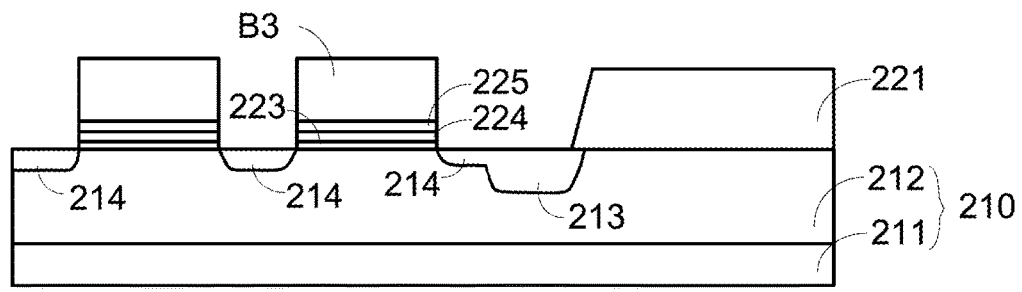
Figure 2J:
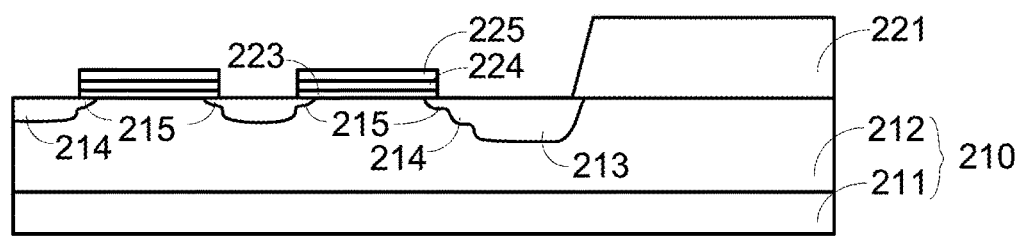
Figure 2K:
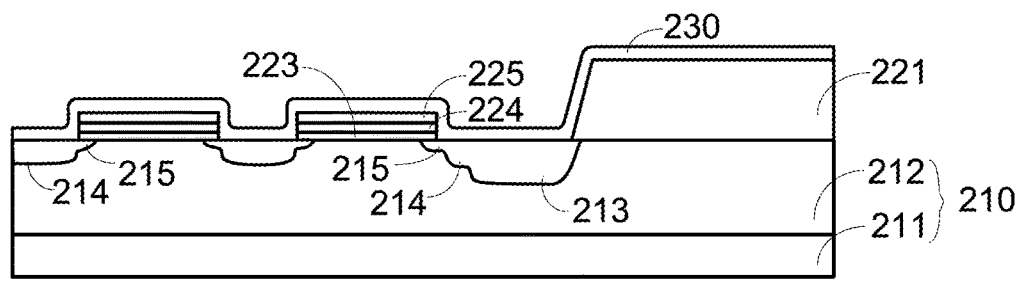
Figure 2L:
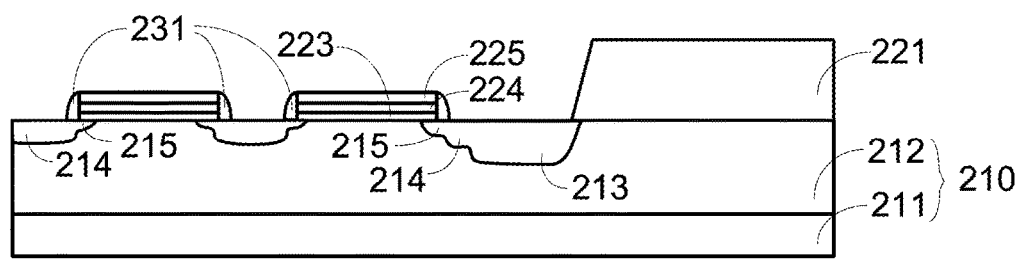
Figure 2M:
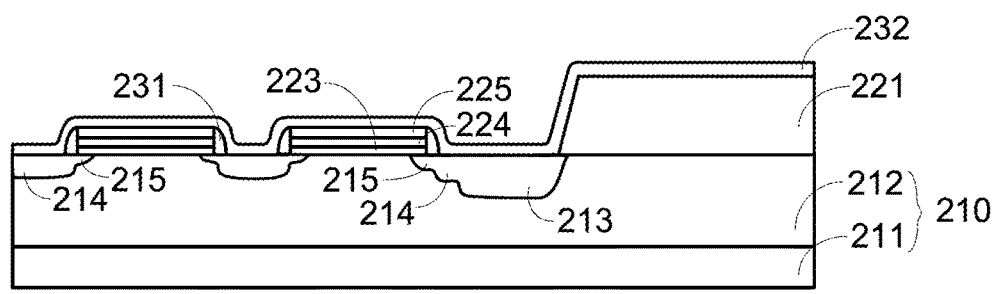
Figure 2N:
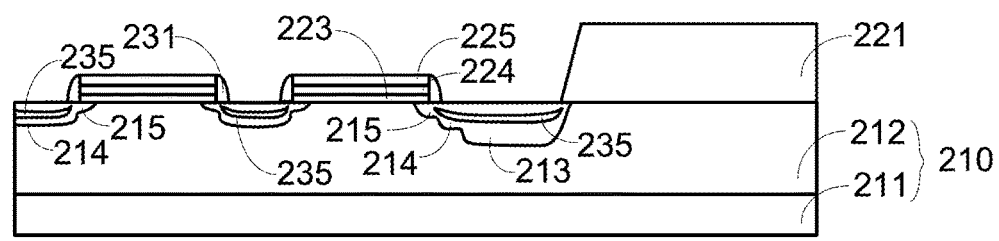
Figure 2O:
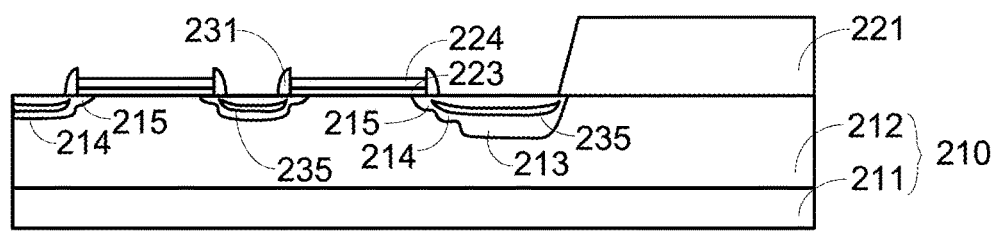
Figure 2P:
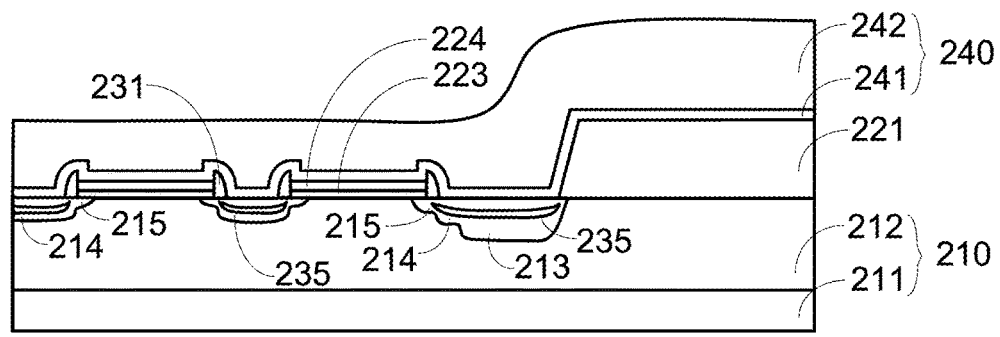
Figure 2Q:
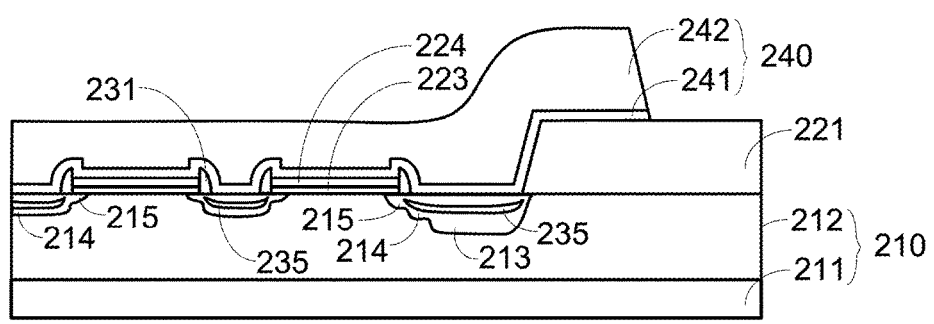

Please refer to FIGS. 2A~2Q, which schematically illustrate a method of manufacturing a metal-oxide-semiconductor (MOS) P-N junction diode with enhanced response speed according to a first embodiment of the present invention.

Firstly, as shown in FIG. 2A, a semiconductor substrate 210 is provided. The semiconductor substrate 210 comprises a heavily-doped (N+ type) silicon layer 211 and a lightly-doped (N– type) epitaxial layer 212. The lightly-doped epitaxial layer 212 is formed on the heavily-doped silicon layer 211. Moreover, the lightly-doped epitaxial layer 212 has a specified thickness for facilitating formation of other structures in the subsequent etching process. Then, a thermal oxidation process is performed to form a first oxide layer 221 (e.g. a field oxide layer) is formed on a surface of the semiconductor substrate 210 (i.e. the surface of the lightly-doped epitaxial layer 212).

Then, as shown in FIG. 2B, a first photoresist layer B1 with a first photoresist pattern is formed on the first oxide layer 221. According to the first photoresist pattern, the first oxide layer 221 is etched to have the first photoresist pattern. After the first oxide layer 221 is etched according to the first photoresist pattern, the first photoresist pattern is transferred to the first oxide layer 221. In this embodiment, the first photoresist pattern is used for defining a guard ring. The etching process used in this step is a downward tapered dry etching process. After the etching process is completed and the remaining first photoresist layer B1 is removed, the resulting structure is shown in FIG. 2C.

Meanwhile, the first oxide layer 221 has an opening to expose the semiconductor substrate 210. Then, a second oxide layer 222 is formed on the exposed surface of the semiconductor substrate 210. Then, a first ion implantation process and a thermal drive-in process are performed to form a guard ring layer 213. The resulting structure is shown in FIG. 2D. In this embodiment, the second oxide layer 222 is a pad oxide layer deposited on the silicon substrate. In addition, the thickness of the second oxide layer 222 is about 300 angstroms. In this embodiment, the first ion implantation process is a boron ion implantation process for doping the semiconductor substrate 210 with boron ion (B+). In particular, the first ion implantation process is performed to uniformly dope semiconductor substrate 210 with boron ion or other equivalent materials at a preset implanting depth. Consequently, a P-type dopant is uniformly distributed in the guard ring layer 213.

Then, as shown in FIG. 2E, a second photoresist layer B2 with a second photoresist pattern is formed on a part of the first oxide layer 221. According to the second photoresist pattern, the first oxide layer 221 and the second oxide layer 222 are etched, so that the second photoresist pattern is transferred to the first oxide layer 221. Meanwhile, the remaining first oxide layer 221 is served as a mask layer (see FIG. 2F). In this embodiment, the second photoresist layer B2 is formed on the first oxide layer 221 at a side of the opening, so that the first oxide layer 221 at another side of the opening is removed.

In addition, the exposed second oxide layer 222 is also removed. In some embodiments, a small part of second oxide layer 222 underlying the second photoresist layer B2 may be retained, so that the structure corresponding to the retained second oxide layer 222 in the subsequent steps. In this embodiment, the retained second oxide layer 222 is removed by an etching process after the second photoresist layer B2 is removed.

Then, as shown in FIG. 2G, a gate oxide layer 223 is formed on the exposed surfaces of the semiconductor substrate 210 and the guard ring layer 213, then a polysilicon structure 224 is formed on the gate oxide layer 223 and the first oxide layer 221 (i.e. the mask layer), and then a polysilicon oxide layer 225 is formed on the polysilicon structure 224. In this embodiment, the polysilicon structure 224 is formed on the gate oxide layer 223 and the first oxide layer 221 (i.e. the mask layer) by a chemical vapor deposition (CVD) process. In addition, the polysilicon oxide layer 225 on the polysilicon structure 224 is produced by oxidizing the polysilicon structure 224.

Then, as shown in FIG. 2H, a third photoresist layer B3 with a third photoresist pattern is formed on the polysilicon oxide layer 225. The third photoresist pattern corresponds to the gate pattern of the wafer. Then, as shown in FIG. 2I, according to the third photoresist pattern, a dry etching process is performed to vertically and downwardly etch the polysilicon oxide layer 225, the polysilicon structure 224 and the gate oxide layer 223. Consequently, the third photoresist pattern is transferred to the polysilicon oxide layer 225, the polysilicon structure 224 and the gate oxide layer 223. Moreover, as also shown in FIG. 2I, a second ion implantation process is performed to dope the semiconductor substrate 210 with boron ion (B+), so that a central conductive layer 214 is formed in the semiconductor substrate 210. In this embodiment, the central conductive layer 214 is a deep doped region. As shown in FIG. 2I, a first side of the guard ring layer 213 is connected with the first oxide layer 221 (i.e. the mask layer), the central conductive layer 214 is separated from the gate oxide layer 223 and the polysilicon structure 224, and a part of the central conductive layer 214 is connected with a second side of the guard ring layer 213. Consequently, the central conductive layer 214 and the guard ring layer 213 are collectively defined as the same doped region.

Then, as shown in FIG. 2J, the third photoresist layer B3 is removed. Then, a third ion implantation process is performed to dope the semiconductor substrate 210 with boron ion (B+), so that a channel region 215 is formed in the semiconductor substrate 210 and located beside the central conductive layer 214. In this embodiment, the channel region 215 is a shallow doped region. That is, the channel region 215 is disposed under the gate oxide layer 223. In this embodiment, a sidewall of the channel region has a 45-degree slant surface.

Then, as shown in FIG. 2K, a deposition layer 230 is formed on the exposed surfaces of the first oxide layer 221 (i.e. the mask layer), the polysilicon oxide layer 225, the polysilicon structure 224, the gate oxide layer 223, the guard ring layer 213 and the central conductive layer 214 by a chemical vapor deposition (CVD) process. For example, the deposition layer 230 is made of silicon nitride (SiN) and has a thickness of about 1000 angstroms. Then, as shown in FIG. 2L, an etch-back process is performed to partially remove deposition layer 230. That is, a dry etching process is performed to uniformly and downwardly etch the deposition layer 230 for a preset etching time period without the need of using any photoresist pattern. After the etch-back process is done, the surface of the first oxide layer 221 (i.e. the mask layer) is exposed, and the surfaces of the polysilicon oxide layer 225, the guard ring layer 213 and the central conductive layer 214 are partially exposed. Consequently, a silicon nitride layer 231 is formed on a part of the surface of the central conductive layer 214. In addition, the silicon nitride layer 231 is also formed on the sidewalls of the polysilicon structure 224 and the gate oxide layer 223 to be served as a spacer. The polysilicon structure 224 is collectively defined as a gate electrode. The resulting structure is shown in FIG. 2L.

Then, as shown in FIG. 2M, a metallic evaporation film 232 is formed on the exposed surfaces of the first oxide layer 221 (i.e. the mask layer), the polysilicon oxide layer 225, the guard ring layer 213, the central conductive layer 214 and the silicon nitride layer 231 by an evaporation process. In this embodiment, the metallic evaporation film 232 is made of gold (Au) or platinum (Pt) and has a thickness of several hundred angstroms. Then, the metallic evaporation film 232 is subject to a diffusion treatment to diffuse the material of the metallic evaporation film 232 into the guard ring layer 213 and the central conductive layer 214. Consequently, a metal diffusion layer 235 is formed within the guard ring layer 213 and the central conductive layer 214 (see FIG. 2N). After the diffusion treatment is performed, the metallic evaporation film 232 is removed. Then, as shown in FIG. 2O, a wet etching process is performed to remove the polysilicon oxide layer 225. Under this circumstance, the silicon nitride layer 231 is located at bilateral sides of the polysilicon structure 224 is protruded over the polysilicon structure 224.

Then, as shown in FIG. 2P, a metal sputtering process is performed to form a metal sputtering layer 240 on the exposed surfaces of the first oxide layer 221 (i.e. the mask layer), the polysilicon structure 224, the guard ring layer 213, the central conductive layer 214 and the silicon nitride layer 231. In this embodiment, the metal sputtering layer 240 comprises a first metal layer 241 and a second metal layer 242. The metal sputtering layer 240 is produced by the following steps. Firstly, the first metal layer 241 is sputtered on the exposed surfaces of the first oxide layer 221 (i.e. the mask layer), the polysilicon structure 224, the guard ring layer 213, the central conductive layer 214 and the silicon nitride layer 231. Meanwhile, the whole top surface of the wafer is covered with the first metal layer 241. Then, a rapid thermal processing (RTP) process is performed to form metal/silicon alloy. Then, a second metal layer 242 is sputtered on the first metal layer 241. The first metal layer 241 is a made of titanium (Ti) or titanium nitride (TiN). The second metal layer 242 is made of aluminum/silicon/copper (Al/Si/Cu) alloy.

Then, the metal sputtering layer 240 is partially removed to expose a part of the surface of the first oxide layer 221 (i.e. the mask layer) by an etching process. The resulting structure is shown in FIG. 2Q. In this step, the etching process is a metal etching process, which is used to remove the first metal layer 241 and the second metal layer 242 of the metal sputtering layer 240 uncovered by a fourth photoresist layer with a fourth photoresist pattern (not shown). According to the fourth photoresist pattern, the right-side area of the wafer as shown in FIG. 2P is subject to the metal etching process. After the metal etching process is completed, the fourth photoresist layer is removed. The resulting structure is shown in FIG. 2Q. Moreover, after the metal etching process, a sintering process is performed to facilitate adhesion of the metal sputtering layer 240 onto the adjacent structures. Afterwards, a wafer acceptance test (WAT) is performed to test the electrical property of the finished wafer.

The finished wafer fabricated by the method according to the first embodiment of the present invention is shown in FIG. 2Q. As shown in FIG. 2Q, the MOS P-N junction diode comprises a semiconductor substrate 210, a first oxide layer 221 (i.e. a mask layer), a guard ring layer 213, a gate oxide layer 223, a polysilicon structure 224, a central conductive layer 214, a silicon nitride layer 231, a metal diffusion layer 235, a channel region 215, and a metal sputtering layer 240. The first oxide layer 221 (i.e. the mask layer) is formed on the semiconductor substrate 210, and the first oxide layer 221 at the right-side area of the wafer is partially exposed. The guard ring layer 213 is formed in the semiconductor substrate 210 by an ion implantation process and a thermal drive-in process. In addition, a first side of the guard ring layer 213 is connected with the first oxide layer 221 (i.e. the mask layer). The gate oxide layer 223 is formed on a part of the surface of the semiconductor substrate 210. The polysilicon structure 224 is formed on the gate oxide layer 223. The central conductive layer 214 is formed in the semiconductor substrate 210 by another ion implantation process. In addition, a part of the central conductive layer 214 is connected with a second side of the guard ring layer 213. The central conductive layer 214 is separated from the gate oxide layer 223. The silicon nitride layer 231 is formed on a part of the surface of the central conductive layer 214, and located at bilateral sides of the polysilicon structure 224. In addition, the silicon nitride layer 231 is protruded over the polysilicon structure 224. The metal diffusion layer 235 is formed within the guard ring layer 213 and the central conductive layer 214 by metal diffusion. The channel region 215 is formed in the semiconductor substrate 210 by another ion implantation process. In addition, the channel region 215 is located beside the central conductive layer 214 and disposed under the gate oxide layer 223. The metal sputtering layer 240 is formed on the first oxide layer 221 (i.e. the mask layer), the polysilicon structure 224, the guard ring layer 213, the central conductive layer 214 and the silicon nitride layer 231.

It is noted that numerous modifications and alterations of the MOS P-N junction diode may be made while retaining the teachings of the invention. Hereinafter, a modification of the MOS P-N junction diode will be illustrated with reference to a second embodiment.

Please refer to FIGS. 3A~3D, which schematically illustrate a method of manufacturing a metal-oxide-semiconductor (MOS) P-N junction diode with enhanced response speed according to a second embodiment of the present invention.

In this embodiment, the front-end steps are similar to those described in FIGS. 2A~2H. That is, a semiconductor substrate 310 including a heavily-doped (N+ type) silicon layer 311 and a lightly-doped (N– type) epitaxial layer 312 is provided. A first oxide layer 321 is formed at the right side of the semiconductor substrate 310, and served as a mask layer. A first ion implantation process and a thermal drive-in process are performed to form a guard ring layer 313 in the semiconductor substrate 310. Then, the processes of forming the gate oxide layer 323, the polysilicon structure 324 and the polysilicon oxide layer 325 are similar to the first embodiment, and are not redundantly described herein.

Figure 3A:
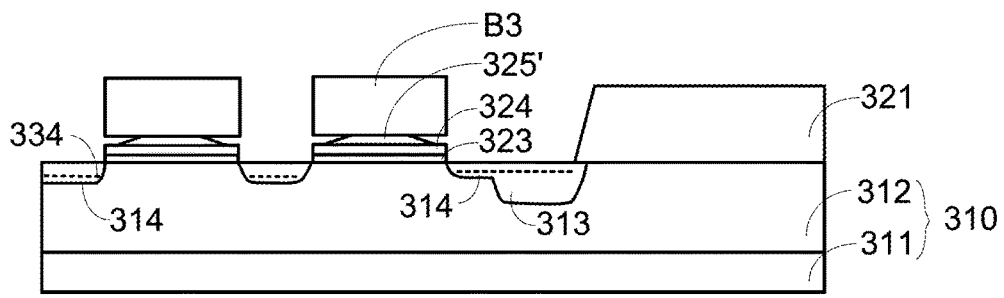
FIGS. 3A~3D schematically illustrate a method of manufacturing a metal-oxide-semiconductor (MOS) P-N junction diode with enhanced response speed according to a second embodiment of the present invention.

After the resulting structure of FIG. 2H is produced, a third photoresist layer B3 with a third photoresist pattern is formed on the polysilicon oxide layer 325' (see FIG. 3A). The third photoresist pattern corresponds to the gate pattern of the wafer. Then, according to the third photoresist pattern, a wet etching process is performed to etch the polysilicon oxide layer 325', and a dry etching process is performed to vertically and downwardly etch the polysilicon structure 324 and the gate oxide layer 323. Consequently, after these etching processes, the polysilicon oxide layer 325' is shorter than each of polysilicon structure 324 and the gate oxide layer 323 (see FIG. 3A). Under this circumstance, the polysilicon oxide layer 325' has a trapezoid profile.

Please refer to FIG. 3A again. A second ion implantation process is performed to dope the semiconductor substrate 310 with boron ion (B+), so that a central conductive layer 314 is formed in the semiconductor substrate 310. The central conductive layer 314 is separated from the gate oxide layer 323 and the polysilicon structure 324, and a part of the central conductive layer 314 is connected with a second side of the guard ring layer 313. Similarly, the central conductive layer 314 is a deep doped region. Moreover, a third ion implantation process is performed to dope the guard ring layer 313 and the central conductive layer 314 with argon ion (Ar+), so that an ion implantation layer 334 is formed within the guard ring layer 313 and the central conductive layer 314.

Figure 3B:
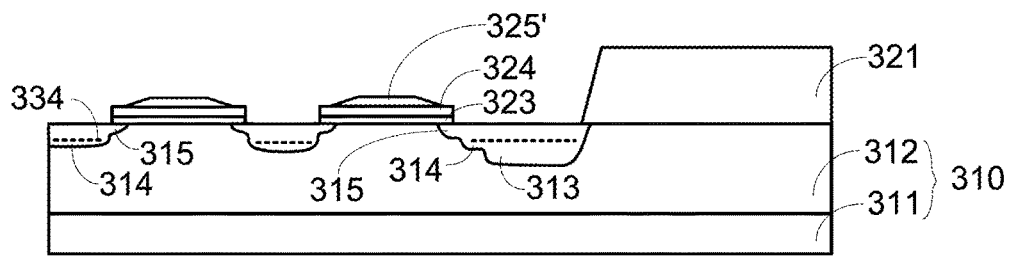

Then, as shown in FIG. 3B, the third photoresist layer B3 is removed. Then, a fourth ion implantation process is performed to dope the semiconductor substrate 310 with boron ion (B+), so that a channel region 315 is formed in the semiconductor substrate 310 and located beside the central conductive layer 314. Similarly, the channel region 315 is a shallow doped region. That is, the channel region 315 is disposed under the gate oxide layer 323. Similarly, a sidewall of the channel region has a 45-degree slant surface.

Figure 3C:
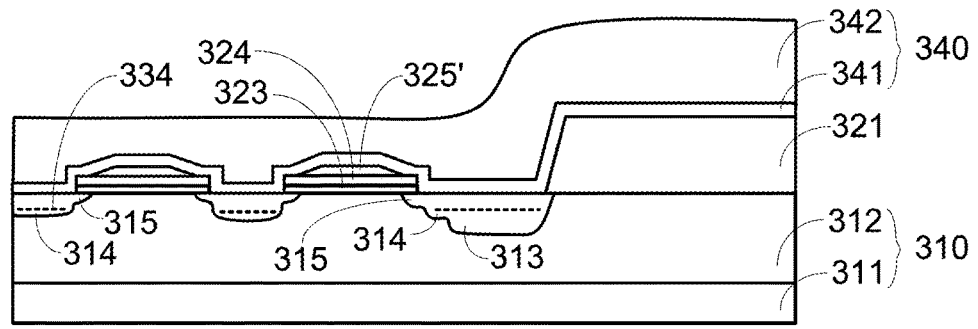

Then, as shown in FIG. 3C, a metal sputtering process is performed to form a metal sputtering layer 340 on the exposed surfaces of the first oxide layer 321 (i.e. the mask layer), the polysilicon oxide layer 325', the polysilicon structure 324, the guard ring layer 313, the central conductive layer 314 and the gate oxide layer 323. In this embodiment, the metal sputtering layer 340 comprises a first metal layer 341 and a second metal layer 342. The metal sputtering layer 340 is produced by the following steps. Firstly, the first metal layer 341 is sputtered on the exposed surfaces of the first oxide layer 321 (i.e. the mask layer), the polysilicon oxide layer 325', the polysilicon structure 324, the guard ring layer 313, the central conductive layer 314 and the gate oxide layer 323. Meanwhile, the whole top surface of the wafer is covered with the first metal layer 341. Then, a rapid thermal processing (RTP) process is performed to correct a result of the metal sputtering process. Then, a second metal layer 342 is sputtered on the first metal layer 341. The first metal layer 341 is a made of titanium (Ti) or titanium nitride (TiN). The second metal layer 342 is made of aluminum/silicon/copper (Al/Si/Cu) alloy.

Figure 3D:
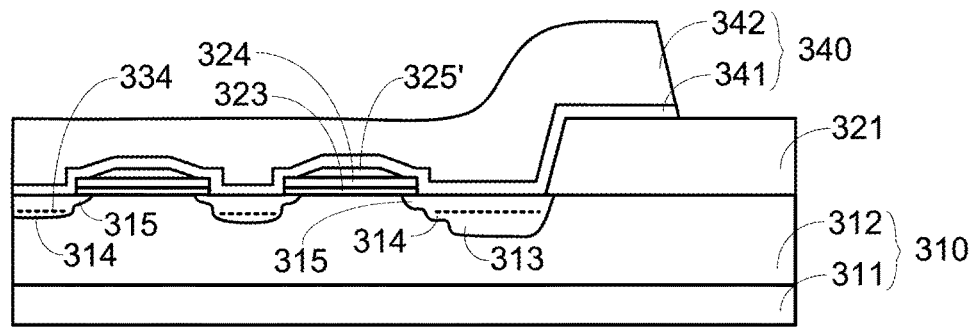

Then, as shown in FIG. 3D, a fourth photoresist layer with a fourth photoresist pattern is formed on the metal sputtering layer 340. Then, the metal sputtering layer 340 uncovered by the fourth photoresist layer (i.e. the right-side area of the wafer as shown in FIG. 3C) is removed by a metal etching process. After the metal etching process is completed, the fourth photoresist layer is removed. Consequently, a part of the surface of the first oxide layer 321 (i.e. the mask layer) is exposed. The resulting structure is shown in FIG. 3D. Moreover, after the metal etching process, a sintering process is performed to facilitate adhesion of the metal sputtering layer 340 onto the adjacent structures. Afterwards, a wafer acceptance test (WAT) is performed to test the electrical property of the finished wafer.

The finished wafer fabricated by the method according to the second embodiment of the present invention is shown in FIG. 3D. As shown in FIG. 3D, the MOS P-N junction diode comprises a semiconductor substrate 310, a first oxide layer 321 (i.e. a mask layer), a guard ring layer 313, a gate oxide layer 323, a polysilicon structure 324, a polysilicon oxide layer 325', a central conductive layer 314, an ion implantation layer 334, a channel region 315, and a metal sputtering layer 340.

The first oxide layer 321 (i.e. the mask layer) is formed on the semiconductor substrate 310, and the first oxide layer 321 at the right-side area of the wafer is partially exposed. The guard ring layer 313 is formed in the semiconductor substrate 310 by an ion implantation process and a thermal drive-in process. In addition, a first side of the guard ring layer 313 is connected with the first oxide layer 321 (i.e. the mask layer). The gate oxide layer 323 is formed on a part of the surface of the semiconductor substrate 310. The polysilicon structure 324 is formed on the gate oxide layer 323. The polysilicon oxide layer 325' is disposed over the polysilicon structure 324. The central conductive layer 314 is formed in the semiconductor substrate 310 by another ion implantation process. In addition, a part of the central conductive layer 314 is connected with a second side of the guard ring layer 313. The central conductive layer 314 is separated from the gate oxide layer 323. The ion implantation layer 334 is formed within the guard ring layer 313 and the central conductive layer 314 by another ion implantation process. The channel region 315 is formed in the semiconductor substrate 310 by another ion implantation process. In addition, the channel region 315 is located beside the central conductive layer 314 and disposed under the gate oxide layer 323. The metal sputtering layer 340 is formed on the first oxide layer 321 (i.e. the mask layer), the polysilicon structure 324, the polysilicon oxide layer 325', the guard ring layer 313, the central conductive layer 314 and the gate oxide layer 323.

In the MOS P-N junction diode manufactured by the method of the present invention, the area of the wafer beside the first oxide layer 321 (i.e. the mask layer) is served as the guard ring for isolating from the external environment and minimizing the possibility of generating the leakage current. Moreover, the MOS P-N junction diode has a metal diffusion layer 235 or an ion implantation layer 334. A series of electrical tests demonstrate that the MOS P-N junction diode of the present invention has low reverse leakage current, low forward bias voltage, high reverse voltage tolerance and short reverse recovery time. Consequently, by the MOS P-N junction diode and the manufacturing method of the present invention, the problems encountered from the prior art will be obviated.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A method for manufacturing a MOS P-N junction diode, the method comprising steps of:
   providing a semiconductor substrate;
   performing a first ion implantation process and a thermal drive-in process to form a guard ring layer in the semiconductor substrate;
   forming a mask layer on the semiconductor substrate;
   forming a gate oxide layer on the semiconductor substrate and the guard ring layer, forming a polysilicon structure on the gate oxide layer and the mask layer, and forming a polysilicon oxide layer on the polysilicon structure;
   performing an etching process to partially remove the polysilicon oxide layer, the polysilicon structure and the gate oxide layer, and performing a second ion implantation process to form a central conductive layer in the semiconductor substrate;
   performing a third ion implantation process to form an ion implantation layer within the guard ring layer and the central conductive layer;
   performing a fourth implantation process to form a channel region beside the central conductive layer;
   forming a metal sputtering layer on exposed surfaces of the mask layer, the polysilicon structure, the polysili- con oxide layer, the guard ring layer, the central conductive layer and the gate oxide layer; and etching the metal sputtering layer to partially remove the metal sputtering layer, so that a part of the mask layer is exposed.

2. The method as claimed in claim 1, wherein the semiconductor substrate comprises a heavily-doped silicon layer and a lightly-doped epitaxial layer.

3. The method as claimed in claim 1, wherein the steps of forming the guard ring layer and the mask layer comprise sub-steps of:

forming a first oxide layer on a surface of the semiconductor substrate;

forming a first photoresist layer with a first photoresist pattern on the first oxide layer;

etching the first oxide layer according to the first photoresist pattern, so that the first photoresist pattern is transferred to the first oxide layer;

removing the first photoresist layer;

forming a second oxide layer on an exposed surface of the semiconductor substrate, and performing the first ion implantation process and the thermal drive-in process to form the guard ring layer;

forming a second photoresist layer with a second photoresist pattern on a part of the first oxide layer;

etching the first oxide layer and the second oxide layer according to the second photoresist pattern, so that the second photoresist pattern is transferred to the first oxide layer, wherein the remaining first oxide layer is served as the mask layer; and removing the second photoresist layer.

4. The method as claimed in claim 1, wherein the step of forming the central conductive layer comprises sub-steps of:

forming a third photoresist layer with a third photoresist pattern on the polysilicon oxide layer;

etching the polysilicon oxide layer, the polysilicon structure and the gate oxide layer according to the third photoresist pattern, so that the third photoresist pattern is transferred to the polysilicon structure and the gate oxide layer, wherein after etched, the polysilicon oxide layer is shorter than the polysilicon structure; and removing the third photoresist layer.

5. The method as claimed in claim 1, wherein the polysilicon structure is formed on the gate oxide layer and the mask layer by a chemical vapor deposition process.

6. The method as claimed in claim 1, wherein the step of forming the metal sputtering layer comprises sub-steps of:

performing a metal sputtering process to form a first metal layer on exposed surfaces of the mask layer, the polysilicon structure, the polysilicon oxide layer, the guard ring layer, the central conductive layer and the gate oxide layer;

performing a rapid thermal processing process to correct a result of the metal sputtering process; and performing another metal sputtering process to form a second metal layer on the first metal layer, wherein the first metal layer and the second metal layer are collectively defined as the metal sputtering layer.

7. The method as claimed in claim 1, wherein the step of etching the metal sputtering layer comprising steps of:

forming a fourth photoresist layer with a fourth photoresist pattern on the metal sputtering layer;

performing a metal etching process to partially remove the metal sputtering layer according to the fourth photoresist pattern, so that the part of the mask layer is exposed; and removing the fourth photoresist layer.

8. The method as claimed in claim 1, wherein after the step of etching the metal sputtering layer, the method further comprises a step of performing a sintering process to facilitate adhesion of the metal sputtering layer.

* * * * *